United States Patent [19]

Fujikura et al.

[11] Patent Number: 5,030,548
[45] Date of Patent: Jul. 9, 1991

[54] PHOTO-POLYMERIZABLE COMPOSITION

[75] Inventors: Sadao Fujikura; Masayuki Iwasaki; Minoru Maeda; Minoru Wada, all of Shizuoka, Japan

[73] Assignee: Fuji Photo Film Co., Ltd., Kanagawa, Japan

[21] Appl. No.: 391,819

[22] Filed: Aug. 10, 1989

[30] Foreign Application Priority Data

Aug. 11, 1988 [JP] Japan ................................. 63-200605

[51] Int. Cl.$^5$ ...................... G03F 7/031; G03F 7/033
[52] U.S. Cl. ................................. 430/281; 430/288; 430/907; 430/910; 430/916; 430/920; 430/925
[58] Field of Search ............... 430/281, 288, 270, 271, 430/916, 919, 920, 925, 907, 910; 522/16

[56] References Cited

U.S. PATENT DOCUMENTS

| 3,479,185 | 11/1969 | Chambers | 430/919 |
|---|---|---|---|
| 3,814,607 | 6/1974 | Nebe | 430/919 |
| 4,175,971 | 11/1979 | Shinozaki et al. | 430/288 |
| 4,232,106 | 11/1980 | Iwasaki et al. | 430/288 |
| 4,239,850 | 12/1980 | Kita et al. | 430/281 |
| 4,264,708 | 4/1981 | Chambers et al. | 430/288 |
| 4,311,783 | 1/1982 | Dessauer | 430/270 |
| 4,351,893 | 9/1982 | Anderson | 430/919 |
| 4,419,438 | 12/1983 | Etoh et al. | 430/919 |
| 4,438,190 | 3/1984 | Ishimaru et al. | 430/919 |
| 4,543,318 | 9/1985 | Maeda et al. | 430/919 |
| 4,584,260 | 4/1986 | Iwasaki et al. | 430/919 |
| 4,629,679 | 12/1986 | Uchida et al. | 430/281 |

*Primary Examiner*—Charles L. Bowers, Jr.
*Assistant Examiner*—John S. Y. Chu
*Attorney, Agent, or Firm*—Sughrue, Mion, Zinn, Macpeak & Seas

[57] ABSTRACT

A photo-polymerizable composition is disclosed, which comprises
a thermoplastic polymeric binder;
a non-gaseous ethylenically unsaturated compound;
a photo-polymerization initiator system composed of 4,4'-bis(dialkylamino)benzophenone, aromatic ketone and lophine dimer;
an organic halogen compound; and a leuco dye.

13 Claims, No Drawings

PHOTO-POLYMERIZABLE COMPOSITION

FIELD OF THE INVENTION

The present invention relates to a photo-polymerizable composition containing photo-polymerization initiator systems in a novel combination. More particularly, it relates to a photo-polymerizable composition which is adapted for the use in lithographic printing plates, resinous letter press printing plates, and as photoresists or photomasks for making print bases having a high sensitivity, a high resolving power and an excellent efficiency of printing out, and which provides excellent film properties.

BACKGROUND OF THE INVENTION

Recently in the electronics industry there has been a demand for an increase in integration thus requiring a photo resist having a higher resolving power. In addition, a higher sensitivity is demanded so as to shorten the time required for production steps.

Studies for enhancing sensitivity of a photo-polymerizable composition have conventionally been conducted and, as a result, many photo-polymerization initiators (systems) have been proposed. For example, U.S. Pat. No. 2,448,828 describes benzoin ethers, U.S. Pat. No. 3,046,127 describes anthraquinones, JP-B-49-11936 (the term "JP-B" as used herein means an "examined Japanese patent publication") (corresponding to U.S. Pat. No. 3,661,588) describes aminophenylketone and an active methylene or amino compound, U.S. Pat. No. 3,682,641 describes Michler's ketones and benzophenone, JP-B-48-38403 describes benzophenone and 4-N,N-diethylaminobenzophenone, JP-B-45-37377 and JP-B-48-38403 describe Michler's ketones and lophine dimers, JP-A-56-35134 (the term "JP-A" as used herein means an "unexamined published Japanese patent application") describes lophine dimers and photo-polymerizable unsaturated monomers, JP-A-59-78339 describes a ternary system of 4-N,N-dialkylaminobenzophenones, benzophenone and an organic halogen compound, and the like.

It is true that the use of these photo-polymerization initiator systems serves to improve sensitivity and resolving power to some extent, but the degree of improvement is still insufficient for satisfying the recent requirements. In addition, when used as dry film resists to be used upon preparation of printed circuit boards, they provide a tenting film with only an insufficient strength upon formation of through-holes according to the tenting process, and hence a film-breaking trouble has been liable to take place during a development or etching step. It is well known that breakage of a film during the development or etching step can cause a serious problem of conduction failure as a result of dissolution with an etching solution of the copper-plated portion inside the through-hole conducting the surface side and the back side to each other.

SUMMARY OF THE INVENTION

It is therefore and object of the present invention to provide a photo-polymerizable composition which has a high sensitivity and a high resolving power, and which can provide excellent film properties.

This and other objects of the present invention will become apparent from the following description thereof.

As a result of various investigations, the inventors have found a photo-polymerizable composition containing a novel combination of photo-polymerization initiator systems capable of attaining the above-described and other objects of the present invention.

That is, the above-described and other objects of the present invention are attained by using a photo-polymerizable composition comprising:
(1) a thermoplastic polymeric binder;
(2) a non-gaseous ethylenically unsaturated compound;
(3) a photo-polymerization initiator system composed of 4,4'-bis(dialkylamino)benzophenone, an aromatic ketone, and a lophine dimer;
(4) an organic halogen compound; and
(5) a leuco dye.

DETAILED DESCRIPTION OF THE INVENTION

The reason why the composition obtains superior effects is not understood, but may be attributed to that the combination serves to markedly enhance the efficiency of photo-polymerization reaction of the non-gaseous ethylenically unsaturated compound.

As the thermoplastic polymeric binder to be used in the photo-polymerizable composition of the present invention, those which satisfy the following requirements are selected from among a wide variety of synthetic, semi-synthetic and natural polymeric substances. That is, compatibility of the binder with the non-gaseous ethylenically unsaturated compound, the photo-polymerization initiator system, the organic halogen compound, and the leuco dye must be good enough not to cause destruction (Separating out) of the mixed state in the production steps of from preparation of a coating solution to a coating and drying step and during storage of coated products, the binder must have properties adapted for the intended use of the present invention (for example, in the case of using as photo resist for tenting, it must possess strength, stretchability, abrasion resistance, chemical resistance, etc.), and molecular weight, intermolecular force, hardness, softening temperature, crystallinity, elongation at breakage, etc. of the binder should be satisfactory for the in tended use.

Specific examples of the binders include homopolymers or copolymers such as chlorinated polyolefins (for example, chlorinated polyethylene and chlorinated polypropylene), polyalkyl (meth)acrylates (examples of the alkyl group include a methyl group, an ethyl group and a butyl group, and examples of the polyalkyl (meth)acrylates include polymethyl (meth)acrylate), copolymers between (meth)acrylic acid and alkyl (meth)acrylate, poly(meth)acrylic acid, copolymers between alkyl (meth)acrylate (examples of the alkyl group are the same as mentioned above) and at least one monomer such as acrylonitrile, vinyl chloride, vinylidene chloride, styrene, butadiene, etc., polyvinyl chloride, a copolymer between vinyl chloride and acrylonitrile, polyvinylidene chloride, a copolymer between vinylidene chloride and acrylonitrile, a copolymer between vinyl acetate and vinyl chloride, polyacrylonitrile, a copolymer between acrylonitrile and styrene, a copolymer between acrylonitrile, butadiene and styrene, a copolymer between styrene and an unsaturated dibasic acid anhydride such as maleic anhydride, polyvinyl butyral, styrene-butadiene rubber, chlorinated rubber, cyclized rubber, acetyl cellulose, and the like.

With copolymers, content ratios of the component monomers may be selected from a wide range but, in general, each comonomer is contained in an amount of preferably 5 mol % or more. Other polymers than are described above may also be used as binders in the present invention as long as they satisfy the foregoing requirements.

Of the above-described polymers, those which are preferably used as the binder of the present invention are chlorinated polyethylene, chlorinated polypropylene, polymethyl methacrylate, methyl methacrylate-acrylonitrile copolymer (molar content of methyl methacrylate: 20 to 80%), vinyl chloride-acrylonitrile copolymer (molar content of vinyl chloride: 20 to 80%), vinylidene chloride-acrylonitrile copolymer (molar content of vinylidene chloride: 20 to 80%), styrene-maleic anhydride copolymer, and binders described in JP-A-60-258539 (binder being methyl methacrylate/methacrylic acid/2-ethylhexyl methacrylate/benzyl methacrylate quaternary copolymer), JP-B-54-34327 (corresponding to U.S. Pat. No. 3,804,631) (binders being, for example, a methyl methacrylate/2-ethylhexyl methacrylate/methacrylic acid ternary copolymer), JP-B-55-38961 (binder being a styrene/mono-n-butyl maleate copolymer), JP-B-54-25957 (binders being, for example, a styrene/methyl methacrylate/ethyl acrylate/methacrylic acid quaternary copolymer), JP-A-52-99810 (corresponding to U.S. Pat. No. 4,139,391) (binders being, for example, a benzyl methacrylate/methacrylic acid copolymer), JP-B-58-12577 (binders being, for example, an acrylonitrile/2-ethylhexyl methacrylate/methacrylic acid terpolymer) and JP-B-55-6210 (binders being, for example, a methyl methacrylate/ethyl acrylate/acrylic acid terpolymer and a styrene/maleic acid anhydride copolymer partially esterified with isopropanol). Of these, methyl methacrylate/methacrylic acid/2-ethylhexyl methacrylate/benzyl methacrylate quaternary copolymer is a particularly preferable binder.

These binders may be used independently, or two or more polymers having enough compatibility with each other not to cause separation out of the mixed state in the steps of preparation of a coating solution to coating and drying and during storage of the coated products may be mixed in a proper ratio for use as a binder.

The molecular weight of the high molecular substance to be used as a binder may vary over a wide range depending upon the kind of polymer and intended use but, in general, polymers with a molecular weight of 5,000 to 2,000,000, more preferably 50,000 to 1,000,000 are preferably used in the present invention.

The amount of the binder is 5 to 95 wt %, preferably 40 to 80 wt %, based on the solid components of the photo-polymerizable composition.

Preferable ethylenically unsaturated compounds to be used in the present invention are those compounds which have at least two terminal unsaturated groups and which can be photo-polymerized by irradiation with actinic radiation (e.g., ultraviolet light, etc.). Hereinafter, they are abbreviated as polyfunctional monomers.

Specific examples thereof are the following compounds described in, for example, JP-B-35-5093, JP-B-35-14719 and JP-B-44-28727.

First, as acrylic esters and methacrylic esters, there are illustrated polyacrylates and polymethacrylates (the term "poly" as used herein means "di or more") of polyhydric alcohols. Examples of the polyhydric alcohols include polyethylene glycol, polypropylene glycol, polybutylene glycol, polycyclohexene oxide, polystyrene oxide, polycyclobutane, polytetrahydrofuran, cyclohexanediol, xylylenediol, di-(β-hydroxyethoxy)benzene, glycerin, diglycerin, neopentyl glycol, trimethylolpropane, trimethylolethane, pentaerythritol, dipentaerythritol, sorbitan, sorbitol, butanediol, butanetriol, 2-butene-1,4-diol, 2-n butyl-2-ethylpropanediol, 2-butyne-1,4-diol, 3-chloro-1,2-propanediol, 1,4-cyclohexanedimethanol, 3-cyclohexene-1,1-dimethanol, decalindiol, 2,3-dibromo-2-butene-1,4-diol, 2,2-diethyl-1,3-propanediol, 1,5-dihydroxy-1,2,3,4-tetrahydronaphthalene, 2,5-dimethyl-2,5-hexanediol, 2,2-dimethyl-1,3-propanediol, 2,2-diphenyl-1,3-propanediol, dodecanediol, meso-erythritol, 2 ethyl-1,3-hexanediol, 2-ethyl-2-(hydroxymethyl)-1,3-propanediol, 2-ethyl-2-methyl-1,3-propanediol, heptanediol, hexanediol, 3-hexene-2,5-diol, hydroxybenzyl alcohol, hydroxyethylresorcinol, 2-methyl-1,4-butanediol, 2-methyl-2,4-pentanediol, nonanediol, octanediol, pentanediol, 1-phenyl-1,2-ethanediol, propanediol, 2,2,4,4-tetra-memthyl-1,3-cyclobutanediol, 2,3,5,6-tetramethyl-p-xylene-α,α'-diol, 1,1,4,4-tetraphenyl-1,4-butanediol, 1,1,4,4-tetraphenyl-2-butyne-1,4-diol, 1,2,6-trihydroxyhexane, 1,1'-bi-2-naphthol, dihydroxynaphthalene, 1,1'-methylene-di-2-naphthol, 1,2,4-benzenetriol, biphenol, 2,2-bis(4-hydroxyphenyl)butane, 1,1-bis(4-hydroxyphenyl)cyclohexane, bis(hydroxyphenyl)methane, catechol, 4-chlororesorcinol, 3,4-dihydroxyhydrocinnamic acid, hydroquinone, hydroxybenzyl alcohol, methyl hydroquinone, methyl-2,4,6-trihydroxybenzoate, phloroglucinol, pyrogallol, resorcinol, glucose, α-(1-aminoethyl)p-hydroxybenzyl alcohol, 2-amino-2-ethyl-1,3-propanediol, 2-amino-2-methyl-1,3-propanediol, 3-amino-1,2-propanediol, N-(3-aminopropyl)-diethanolamine, N,N-bis(2-hydroxyethyl)piperazine, 2,2-bis(hydroxymethyl)2,2',2''-nitrilotriethanol, 2,2-bis(hydroxymethyl)propionic acid, 1,3-bis(hydroxymethyl)urea, 1,2-bis(4-pyridyl)-1,2-ethanediol, N-n-butyldiethanolamine, diethanolamine, N-ethylenediethanolamine, 3-mercapto-1,2-propanediol, 3-piperidino-1,2-propanediol, 2-(2-pyridyl)-1,3-propanediol, triethanolamine, α-(1-aminoethyl)p-hydroxybenzyl alcohol, 3-amino-4-hydroxyphenylsulfone, etc. Of these acrylic esters and methacrylic esters, the most preferable ones in view of availability include ethylene glycol diacrylate, diethylene glycol diacrylate, triethylene glycol diacrylate, tetraethylene glycol diacrylate, ethylene glycol dimethacrylate, diethylene glycol dimethacrylate, triethylene glycol dimethacrylate, tetraethylene glycol dimethacrylate, polyethylene glycol diacrylate, tetrapropylene glycol diacrylate, dodecapropylene glycol diacrylate, trimethylolpropane triacrylate, trimethylolpropane trimethacrylate, pentaerythritol tetraacrylate, pentaerythritol triacrylate, pentaerythritol diacrylate, pentaerythritol dimethacrylate, dipentaerythritol pentaacrylate, glycerin triacrylate, diglycerin dimethacrylane, 1,3-propanediol diacrylate, 1,2,4-bytanetriol trimethacrylate, 1,4-cyclohexanediol diacrylate, 1,5-pentanediol diacrylate, neopentyl glycol diacrylate, ethylene oxide-added trimethylolpropane triacrylate, etc.

On the other hand, as acrylamides and methacrylamides, there are illustrated polyacrylamides and polymethacrylamides of ethylenediamine, diaminopropane, diaminobutane, pentamethylenediamine, hexamethylene-bis(2-aminopropyl)amine, diethylenetriaminediamine, heptamethylenediamine, octamethylenediamine, polyamine interrupted by a hetero atom or atoms, and ring-containing polyamine (e.g., phenylenediamine, xylylenediamine, β-(4-aminophenyl-)ethylamine, diaminobenzoic acid, diaminotoluene, diaminoanthraquinone, or diaminofluorene) as well as methylenebisacrylamide and methylenebismethacrylamide.

As allyl compounds, there are illustrated, for example, diallyl esters of dicarboxylic acids (e.g., phthalic acid, terephthalic acid, sebacic acid, adipic acid, glutaric acid, malonic acid and oxalic acid) and diallyl esters or diallylamides of disulfonic acids (e.g., anthraquinonedisulfonic acid, benzenedisulfonic acid, 2,5-dihydroxy-p-benzenedisulfonic acid, dihydroxynaphthalene-disulfonic acid and naphthalenedisulfonic acid).

As vinyl ether compounds, there are illustrated polyvinyl ethers of the aforementioned polyhydric alcohols such as ethylene glycol divinyl ether, 1,3,5-tri-β-vinyloxyethoxybenzene, glycerol trivinyl ether, etc.

As vinyl esters, there are illustrated divinyl succinate, divinyl adipate, divinyl phthalate, divinyl terephthalate, divinylbenzene-1,3-disulfonate, divinylbutane-1,4-disulfonate, etc.

As styrene compounds, there are illustrated divinylbenzene, p-allylstyrene, p-isopropenestyrene, etc.

Those compounds which contain two or more different addition-polymerizable unsaturated bonds such as N-β-hydroxyethyl-β-(methacrylamide)ethyl acrylate, N,N-bis(β-methacryloxyethyl)acrylamide, allyl methacrylate, etc. may also be preferably used in the present invention.

Furthermore, polyfunctional urethane compounds having at least two ethylenically unsaturated groups and being obtained by reacting a reaction product between a polyol compound having at least two hydroxy groups and a slightly excessive amount of a polyisocyanate compound having at least two isocyanato groups with a compound having at least one hydroxy group and at least one ethylenically unsaturated group may also be preferably used in the present invention.

These polyfunctional monomers may be used alone or in combinations of two or more, and are used in a proportion of 5 to 90 wt %, preferably 15 to 60 wt %, of the solid components of the photo-polymerizable composition.

Specific examples of 4,4-bis(dialkylamino)benzophenones to be preferably used in the present invention include 4,4'-bis(dimethylamino)benzophenone, 4,4'-bis(dicyclohexylamino)benzophenone, 4,4'-bis(diethylamino)benzophenone, and 4,4'-bis(dihydroxyethylamino)benzophenone.

Of these, 4,4'-bis(diethylamino)benzophenone is a particularly preferable compound.

The amount of 4,4'-bis(dialkylamino)benzophenone to be used in the present invention is preferably 0.01 wt % to 1 wt % based on the solid components of the photo-polymerizable composition, with 0.05 wt % to 0.5 wt % being more preferable.

Specific examples of the aromatic ketones include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenonetetracarboxylic acid or its tetramethyl ester, 4-methoxy-4'-dimethylaminobenzophenone, 4,4'-dimethoxybenzophenone, 4-dimethylaminobenzophenone, 4-dimethylaminoacetophenone, anthraquinone, 2-tert-butylanthraquinone, 2-methylanthraquinone, phenanthraquinone, xanthone, thioxanthone, 2-chlorothioxanthone, 2,4-dimethylthioxanthone, 2,4-diethylthioxanthone, fluorene, acridone, benzoin and benzoin ethers (e.g., benzoin methyl ether, benzoin ethyl ether, benzoin propyl ether, benzoin isopropyl ether and benzoin phenyl ether), and benzyl dimethyl ketal, with benzophenone being particularly preferable. The aromatic ketone to be used in the present invention is added in an amount of preferably 0.1 wt % to 10 wt %, more preferably 0.5 wt % to 5 wt %, based on the solid components of the photo-polymerizable composition.

As the lophine dimers to be used in the present invention, there are illustrated, for example, those which are described in JP-B-45-37377, JP-B-48-9005 (corresponding to U.S. Pat. No. 3,558,322), JP-B-48-38403 (corresponding to U.S. Pat. No. 3,549,367), JP-B-53 12802 (corresponding to U.S. Pat. No. 3,652,275), JP-B-55-34414 (corresponding to U.S. Pat. No. 3,844,790), JP-A-56-35134 (corresponding to U.S. Pat. Nos. 4,311,783 and 4,252,887), JP-A-56 139508, JP-A-57-21401, JP-A-57-161742 (corresponding to U.S. Pat. No. 4,410,621), JP-A-58-19315, JP-A-59-818, JP-B-59-28329, JP-A-59-56403, JP-A-59-74551 (corresponding to U.S. Pat. No. 4,454,218), etc. Specific preferable examples include 2-(2'-chlorophenyl)-4,5-diphenylimidazole dimer, 2-(2'-chlorophenyl)-4,5-di(3'-methoxyphenylimidazole dimer, 2-(2'-fluorophenyl)-4,5-diphenylimidazole dimer, 2-(2'-methoxyphenyl)-4,5-ciphenylimidazole dimer, 2-(4'-methoxyphenyl)-4,5-diphenylimidazole dimer, etc.

Of these, 2-(2'-chlorophenyl) 4,5-diphenylimidazole dimer and 2-(2'-chlorophenyl)-4,5-di(3'-methoxyphenyl)imidazole dimer are particularly preferable.

The lophine dimer to be used in the present invention is preferably added in an amount of 0.1 wt % to 10 wt %, more preferably 0.5 wt % to 5 wt %, based on the solid components of the photo-polymerizable composition.

In the present invention, conventionally known photo-polymerization initiators may be used in a proper combination in addition to the foregoing 4,4'-bis(dialkylamino)benzophenone, aromatic ketone and lophine dimer. For example, organic sulfur compounds, peroxides, redox compounds, azo and diazo compound, photoreducible dyes, etc. described in J. Kosar; "Light-Sensitive Systems", chapter 5, etc. may be used. These conventional known photo-polymerization initiators are preferably used in an amount of 0.01 to 5 wt %, based on the solid components of the photo-polymerizable composition.

The organic sulfur compounds include di-n-butyldisulfide, dibenzyldisulfide, 2-mercaptobenzothiazole, 2-mercaptobenzoxazole, thiophenol, ethyltrichloromethanesulfenate, 2-mercaptobenzimidazole, etc.

The peroxides include di-t-butyl peroxide, benzoyl peroxide, methyl ethyl ketone peroxide, etc.

The redox compounds comprise a combination of a peroxide and a reducing agent, and include a combination of ferrous ion and persulfate ion, a combination of ferric ion and a peroxide, etc.

The azo and diazo compounds include α,α'-azobisisobutyronitrile, 2-azobis-2-methylbutyronitrile, p-aminodiphenylamine diazonium salt, etc.

The photo-reducible dyes include Rose Bengale, Erythrosin, Eosine, acriflavine, riboflavin, Thionine, etc.

As the organic halogen compounds to be used in the present invention, compounds selected from the compounds described in JP-A-59 78339 (corresponding to U.S. Pat. No. 4,584,260) and represented by the following general formulae IIIa to IIIe are preferable:

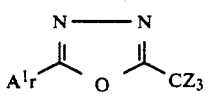  IIIa wherein $A^1r$ represents a substituted or unsubstituted phenyl or a substituted or unsubstituted naphthyl group, and Z represents a chlorine atom or a bromine atom;

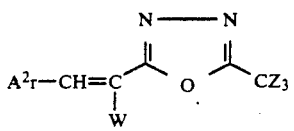  IIIb wherein $A^2r$ represents a substituted or unsubstituted aryl group, W represents a hydrogen atom or a $C_1$ to $C_{20}$ alkyl or a $C_6$ to $C_{20}$ aryl group, and Z represents a chlorine atom or a bromine atom;

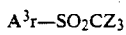  IIIc wherein $A^3r$ represents a substituted or unsubstituted phenyl or a substituted or unsubstituted naphthyl group, and Z represents a chlorine atom or a bromine atom;

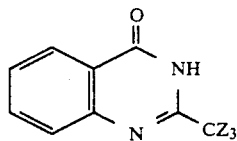  IIId wherein Z represents a chlorine atom or a bromine atom; and

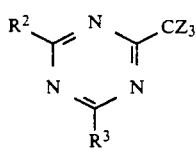  IIIe wherein $R^2$ represents $CZ_3$ or a substituted or unsubstituted phenyl or a substituted or unsubstituted naphthyl group, $R^3$ represents $CZ_3$, $NH_2$, $NHR^4$, $N(R^4)_2$, $SR^4$, $OR^4$ or $R^4$, $R^4$ represents a $C_1$ to $C_{20}$ alkyl, a $C_6$ to $C_{20}$ aryl or a $C_2$ to $C_{20}$ alkenyl group, and Z represents a chlorine atom or a bromine atom.

Compounds of the general formula IIIa include those compounds which are described in JP-A-55-77742 (corresponding to U.S. Pat. No. 4,279,982), and preferable examples thereof include 2-trichloromethyl-5-phenyl-1,3,4-oxadiazole, 2-trichloromethyl-5-(4-chlorophenyl)1,3,4-oxadiazole, 2-trichloromethyl-5-(1-naphthyl)1,3,4-oxadiazole, 2-trichloromethyl-5-(2-naphthyl)1,3,4-oxadiazole, 2-tribromomethyl-5-phenyl-1,3,4-oxadiazole, 2-tribromomethyl-5-(2-naphtyl)-1,3,4-oxadiazole, etc., with 2-trichloromethyl-5-(1-naphthyl)-1,3,4-oxadiazole and 2-trichloromethyl-5-(4-chlorophenyl)-1,3,4-oxadiazole being particularly preferable.

Compounds represented by the general formula IIIb include those compounds which are described in JP-A-54-74728, and preferable examples thereof include 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-4-n-butoxystyryl)-1,3,4-oxadiazole, and 2-tribromomethyl-5-styryl-1,3,4-oxadiazole. Of these compounds, 2-trichloromethyl-5-(4-chlorostyryl)-1,3,4-oxadiazole and 2-trichloromethyl-5-(4-n-butoxystyryl)-1,3,4-oxadiazole are particularly preferable.

Specific examples of the compounds represented by the general formula IIIc include phenyl tribromomethyl sulfone, p-nitrophenyl tribromomethyl sulfone, and p-chlorophenyl tribromomethyl sulfone, with phenyl tribromomethyl sulfone being particularly preferable.

Specific examples of the compounds represented by the general formula IIId include 2-trichloromethylquinazolinone and 2-tribromomethylquinazolinone, with 2-trichloromethylquinazolinone being particularly preferable.

Compounds represented by the general formula IIIe are those compounds which are described in JP-A-54-74887 (corresponding to U.S. Pat. No. 4,239,850), and specific examples thereof include 2,4,6-tris(trichloromethyl)-s-triazine, 2-phenyl-4,6-bis(trichloromethyl)-s-triazine, 2-(4-methoxyphenyl)-4,6-bis(trichloromethyl)-s-triazine, and 2-(4-chlorophenyl)4,6-bis(tribromomethyl)-s-triazine, with 2,4,6-tris(trichloromethyl)-s-triazine and 2-(4-methoxyphenyl)-4,6-bis(trichloromethyl)-s-triazine being particularly preferable.

Further examples of the organic halogen compounds usable in the present invention include halogenated hydrocarbons, halogenated alcohol compounds, halogenated carbonyl compounds, halogenated ether compounds, halogenated ester compounds and halogenated amide compounds.

Examples of the halogenated hydrocarbons include tetrabromocarbon, iodoform, 1,2-dibromoethane, 1,1,2,2-tetrabromoethane, 1,1-bis(p-chlorophenyl)-2,2,2-trichloroethane, 1,2-dibromo-1,1,2-trichloroethane, 1,2,3-tribromopropane, 1-bromo-4-chlorobutane, 1,2,3,4-tetrabromobutane, tetrachlorocyclopropene, hexachlorocyclopentadiene, dibromocyclohexane, etc.

Examples of the halogenated alcohol compounds include 2,2,2,-trichloroethanol, tribromoethanol, 1,3-dichloro-2-propanol, 1,1,1-trichloro-2-propanol, di(iodohexamethylene)aminoisopropanol, tribromo-tert-butyl alcohol, 2,2,3-trichlorobutane-1,4-diol, etc.

Examples of the halogenated carbonyl compounds include 1,1-dichloroacetone, 1,3-dichloroacetone, hexachloroacetone, hexabromoacetone, 1,1,3,3-tetrachloroacetone, 1,1,1-trichloroacetone, 3,4-dibromo-2-butanone, 1,4-dichloro-2-butanone, dibromocyclohexanone, etc.

Examples of the halogenated ether compounds include 2-bromoethyl methyl ether, 2-bromoethyl ethyl ether, di(2-bromoethyl) ether, 1,2-dichloroethyl ethyl ether, etc.

The halogenated ester compounds may be esters of halogenated carboxylic acids, halogenated esters of carboxylic acids or halogenated esters of halogenated carboxylic acids. Examples of the esters include bromoethyl acetate, ethyl trichloroacetate, trichloroethyl trichloroacetate, homo- and co-polymers of 2,3-dibromopropyl acrylate trichloroethyl dibromopropionate, ethyl $\alpha,\beta$-dichloroacrylate, etc.

Examples of the halogenated amide compounds include chloroacetamide, bromoacetamide, dichloroacetamide, trichloroacetamide, tribromoacetamide, trichloroethyltrichloroacetamide, 2-bromoisopropionamide, 2,2,2-trichloropropionamide, N-chlorosuccinimide, N-bromosuccinimide, etc.

Of the organic halogen compounds, those compounds which have one or more halogen atoms bound to the same carbon atom are preferable, with those which have three halogen atoms bound to the same carbon atom being particularly preferable. The organic halogen compounds may be used alone or in combination of two or more.

Of these organic halogen compounds, tribromomethyl phenyl sulfone and 2,4-bis(trichloromethyl)-6-phenyltriazole are particularly preferable.

The organic halogen compounds to be used in the present invention are used in amounts of 0.001 wt % to 5 wt %, more preferably 0.005 wt % to 1 wt %, based on the solid components of the photo-polymerizable composition.

A thermal polymerization inhibitor is preferably further added to the photo-polymerizale composition to be used in the present invention. Examples of thermal polymerization inhibitors include p-methoxyphenol, hydroquinone, alkyl- or aryl-substituted hydroquinones, t-butylcatechol, pyrogallol, cuprous chloride, chloranil, naphthylamine, $\beta$-naphthol, 2,6-di-t-butyl-p-cresol, pyridine, nitrobenzene, dinitrobenzene, p-toluidine, Methylene Blue, organic copper, methyl salicylate, etc. These thermal polymerization inhibitors are incorporated in amounts of preferably 0.001 to 5 wt % based on the polyfunctional monomer.

In order to control film properties, a plasticizer may be added to the composition. Typical examples thereof include phthalic acid esters (e.g., dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate and diaryl phthalates), glycol esters (e.g., dimethyl glycol phthalate, ethylphthalylethyl glycolate, methylphthalylethyl glycolate, butylphthalylbutyl glycolate, dicaprylic acid ester of triethylene glycol, etc.), phosphoric acid esters (e.g., tricresyl phosphate and triphenyl phosphate), aliphatic dibasic acid esters (e.g., diisobutyl adipate, dioctyl adipate, dimethyl sebacate, dibutyl sebacate, dioctyl sebacate and dibutyl maleate), amides (e.g., benzenesulfonamide, p-toluenesulfonamide and N-n-butylacetamide), triethyl citrate, triacetyl ester of glycerin, butyl laurate, etc. Of these, p-toluenesulfonamide is particularly preferable.

Typical examples of the leuco dyes to be used in the present invention include aminotriarylmethanes (e.g., tris(p-dimethylaminophenyl)methane, (leucocrystal violet), tris(p-diethylaminophenyl)methane, tris(p-dimethylamino-o-methylphenyl)methane, tris(p-diethylamino-o-methylphenyl)methane, bis(p-dibutylaminophenyl)-[p-(2-cyanoethyl)methylaminophenyl]methane, bis(p-dimethylaminophenyl)-2-quinolylmethane, tris(p-dipropylaminophenyl)methane, etc.), aminoxanthenes (e.g., 3,6-bis(diethylamino)-9-phenylxanthene and 3-amino-6-dimethylamino-2-methyl-9-(o-chlorophenyl)xanthene), aminothioxanthenes (e.g., 3,6-bis(diethylamino)-9-(o-ethoxycarbonylphenyl)thioxanthene and 3,6-bis(dimethylamino)thioxanthene), amino-9,10-dihydroacridines (e.g., 3,6-bis(diethylamino)-9,10-dihydro-9-phenylacridine and 3,6-bis(benzylamino)-9,10-dihydro-9-methylacridine), aminophenoxazines (e.g., 3,7-bis(diethylamino)phenoxazines), aminophenothiazines (e.g., 3,7-bis(ethylamino)phenothiazine), aminodihydrophenazines (e.g., 3,7-bis(diethylamino)-5-hexyl-5,10-dihydrophenazine), aminophenylmethanes (e.g., bis(p-dimethylaminophenyl)anilinomethane), 4-amino-4'-dimethylaminodiphenylamine, aminohydrocinnamic acids (e.g., methyl 4-amino-$\alpha,\beta$-dicyanohydrocinnamate), hydrazines (e.g., 1-(2-naphthyl)2-phenylhydrazine), amino-2,3-dihydroanthraquinones (e.g., 1,4-bis(ethylamino)-2,3-dihydroanthraquinone), phenethylanilines (e.g., N,N-diethyl-p-phenethylaniline), acyl derivatives of leuco dyes containing a basic NH group (e.g., 10-acetyl-3,7-bis(dimethylamino)phenothiazine), leuco-like compounds which do not have oxidizable hydrogen but can be oxidized to colored compounds (e.g., tris(4-diethylamino-o-tolyl)ethoxycarbonylmethane), leucoindigoid dyes, organic amines capable of being oxidized to colored forms as described in U.S. Pat. Nos. 3,042,515 and 3,042,517 (typical examples of this type compounds including 4,4'-ethylenediamine, diphenylamine, N,N-dimethylaniline, 4,4'-methylenediaminetriphenylamine, and N-vinylcarbazole). Of these, leuco-crystal violet is particularly preferable.

The leuco dyes to be used in the present invention are used in amounts of 0.01 to 10 wt %, more preferably 0.05 to 5 wt %, based on the solid components of the photo-polymerizable composition.

In the present invention, dyes may be used for the purpose of coloring the photo-polymerizable composition or imparting storage stability. Examples of suitable dyes include Brilliant Green sulfate, Eosine, Ethyl Violet, Erythrosine B, Methyl Green, Crystal Violet, Basic Fuchsine, phenolphthalein, 1,3-diphenyltriazine, Alizarine Red S, Thymolphthalein, Methyl Violet 2B, Quinaldine Red, Rose Bengale, Metanil Yellow, Thymolsulfophthalein, Xylenol Blue, Methyl Orange, Orange IV, diphenylthiocarbazone, 2,7-dichlorofluorescein, Paramethyl Red, Congo Red, Benzopurpurin 4B, $\alpha$-Naphthyl Red, Nile Blue A, phenacetarin, Methyl Violet, Malachite Green oxalate, Parafuchsine, Oil Blue #603 (made by Orient Kagaku Kogyo), Rhodamine B, Rhodamine 6G, etc.

Of these dyes Malachite Green oxalate is particularly preferable.

In the present invention, so-called adhesion-promoting agents known in the art may be used for improving adhesion. For example, there are illustrated those compounds which are described in JP-B-50-9177 (corresponding to U.S. Pat. No. 3,622,334), JP-B-54-5292 (corresponding to U.S. Pat. No. 3,873,316), JP-B-55-22481, JP-A-51-64919, JP-A-51-64920 (corresponding to U.S. Pat. No. 4,233,395), JP-A-50-63087, JP-A-52-2724 (corresponding to U.S. Pat. No. 4,197,132), JP-A-53-702, JP-A-53-124541, JP-A-53-124594, JP-A-54-133585, JP-A-54-133586, JP-A-55-65947, JP-B-57-46053, JP-B-57-46054, JP-A-56-11904, JP-B-57-21697 (corresponding to U.S. Pat. No. 4,320,189), JP-A-56-75642, JP-A-56-67844, JP-B-57-40500, JP-A-56-99202, JP-A-56-100803, JP-A-57-60327, JP-A-57-62047, DAS 2,448,850, U.S. Patent 4,629,679, JP-B-57-49894, JP-A-57-148392, JP-A-57-192946, JP-A-58-100844, JP-A-59-113432 (corresponding to U.S. Patent 4,572,888), JP-A-59-125725, JP-A-59-125726, JP-A-59-125727, JP-A-59-125728, JP-A-59-152439, JP-A-59-154440, JP-A-59-154441, JP-A-59-165051, JP-A-60-12543 (corresponding to U.S. Pat. No. 4,543,318), JP-A-60-12544 (corresponding to U.S. Pat. No. 4,543,318), JP-A-60-135931, JP-A-60-138540, JP-A-60-146233, JP-A-61-4038, JP-A-61-6644, JP-A-61-6646, JP-A-61-166541 (corresponding to U.S. Pat. No. 4,741,987), JP-A-61-172139 (corresponding to U.S. Pat. No. 4,657,942), JP-A-61-186952, JP-A 61 190330, JP-A-61-198146, JP-A-61-223836, JP-A-61-282835 (corresponding to U.S. Pat. No. 4,756,994), JP-A-61-360237, JP-A-62-91935, JP-A-62-96939, JP-A-62-180354, JP-A-62-180355, JP-A-62-180356, JP-A-62-180357, JP-A-62-181303, JP-A-62-208042, JP-A-62-240950 (corresponding to U.S. Pat. No. 4,693,959), JP-A-62-277405, JP-A-62-286035, JP-A-62-290702, JP-B-63-13526 (corresponding to U.S. Pat. No. 4,268,610), JP A-63-24243 (corresponding to U.S. Pat. Nos. 4,680,249 and 4,710,262), JP-A-63-57622, amd JP-A-63-61241.

Specifically, there are illustrated benzimidazole, benzoxazole, benzothiazole, 2-mercaptobenzimidazole, 2-mercaptobenzoxazole, 2-mercaptobenzothiazole, 3-morpholinomethyl-1-phenyl-triazole-2-thione, 3-morpholinomethyl-5-phenyl-oxadiazole-2-thione, 5-amino3-morpholinomethyl-thiadiazole-2-thione, 2-mercapto-5-methylthio-thiadiazole, and the like, with 3-morpholinomethyl-2-phenyltriazole-2-thione being particularly preferable.

In general, the photo-polymerizable composition of the present invention is used in such manner that it is dissolved or dispersed in a solvent, and the resulting coating solution is coated on a support by a proper process and dried and, if necessary, a protective film is provided thereon to form an image-forming material.

As the solvent for the coating solution, there are illustrated, for example, alcohols (e.g., methanol, ethanol, n-propanol, isopropanol, n-butanol, sec-butanol and n-hexanol), ketones (e.g., acetone, methyl ethyl ketone, methyl isobutyl ketone, cyclohexanone and diisobutyl ketone), esters (e.g., ethyl acetate, butyl acetate, n-amyl acetate, methyl formate, ethyl propionate, dimethyl phthalate and ethyl benzoate), aromatic hydrocarbons (e.g., toluene, xylene, benzene and ethylbenzene), halogenated hydrocarbons (e.g., tetrachlorocarbon, trichloroethylene, chloroform, 1,1,1-trichloroethane, methylene chloride and monochlorobenzene), ethers (e.g., tetrahydrofuran, diethyl ether, ethylene glycol monomethyl ether, ethylene glycol monoethyl ether and 1-methoxy-2-propanol), dimethylformamide, dimethylsulfoxide, etc.

The photo-polymerizable composition of the present invention may be coated on a support to use and, if desired, a protective film may be provided on the photo-polymerizable composition layer. As such protective layer, a proper one may be selected from among those which are described to be used as the support for papers (e.g., paper laminated with polyethylene, polypropylene or the like). The thickness of the protective layer is generally 5 to 100 µm, more preferably 10 to 50 µm. In this situation, it is necessary to adjust adhesion force A between the photo-polymerizable composition layer and the support be larger than adhesion force B between the photo-polymerizable composition layer and the protective film (i.e., A>B). Specific examples of the combination of support/protective film include polyethylene terephthalate/polypropylene, polyethylene terephthalate/polyethylene, polyamide (nylon 6)/polyethylene, polyvinyl chloride/cellophane, polyimide/polypropylene, etc.

Supports to be used as the aforesaid support should have a good light-transmitting property and a uniform surface. Specifically, various plastic films such as films of polyethylene terephthalate, polypropylene, polyethylene, cellulose triacetate, cellulose diacetate, polyalkyl (meth)acrylate, poly(meth)acrylate copolymer, polyvinyl chloride, polyvinyl alcohol, polycarbonate, polystyrene, cellophane, polyvinylidene chloride copolymer, polyamide, polyimide, vinyl chloride-vinyl acetate copolymer, polytetrafluoroethylene, polytrifluoroethylene, etc. A composite material composed of two or more of these films may also be used.

The support to be used has a thickness of generally 5 to 150 µm, preferably 10 to 50 µm, but films with a thickness outside the above-described range may also be used.

Thickness of the aforesaid photo-polymerizable composition to be provided on the support is a thickness that is enough for the finally formed image to exhibit desired functions, but is generally in the range of from 5 to 100 µm, preferably 10 to 80 µm.

Aside from selecting different films as the support and the protective film as described above, the aforementioned relation on adhesion force can be attained by subjecting at least one of the support and the protective film to a surface treatment. Surface treatment of the support is generally conducted for enhancing adhesion force with the photo-polymerizable composition layer, and such surface treatment is conducted by providing a subbing layer or by conducting corona discharge treatment, flame treatment, ultraviolet ray irradiation, high frequency application, glow discharge irradiation, actinic plasma irradiation, laser irradiation, etc.

Surface treatment of the protective film is conducted generally for decreasing adhesion force with the photo-polymerizable composition layer contrary to the above-described surface treatment for the support, and is conducted by, for example, providing a subbing layer of polyorganosiloxane, fluorinated polyolefin, polyfluoroethylene or the like.

Drying after the coating of the photo-polymerizable composition is conducted at a temperature of generally 30° C. to 150° C., particularly 50° C. to 120° C., for 1 to 30 minutes.

When the aforementioned image-forming material has a protective film, the protective film is peeled apart to lay bare the surface of the photo-polymerizable composition layer, and the surface is laminated on a desired and cleaned surface of a base board under pressure.

As the base board, various ones may be used depending upon the end-use of the composition of the present invention. For example, plastic films having a different adhesion force with the photo-polymerizable layer from those used for the support, paper, wood, metal plates, glass plates, etc. are used. In the case of using the composition of the present invention as a resist for forming printed circuits, printed-circuit base boards comprising a plastic plate having laminated or plated thereon a thin film of a metal such as copper, aluminum or silver or comprising a plastic plate having through-holes (holes formed through the plastic plate) and having laminated or plated on the inside surface of the through-holes the thin metal film described above, or base boards comprising a thin plastic film having vacuum-deposited or plated thereon a thin film of metal are used. Further, in the case of using the composition of the present invention for printing plates, an aluminum plate, a plastic film having provided thereon an aluminum layer, and the like are used. In this case, surface of the metal such as aluminum is preferably subjected to silicate treatment, anodizing treatment or the like.

Lamination of the photo-polymerizable composition layer to these base boards may be conducted at room temperature (15° to 30° C.) or under heating (30° to 180° C.), particularly preferably at 80° to 140° C.

The light-sensitive layer and the support thus laminated on the base board is then imagewise exposed through the transparent support and generally though an original mask. As the light source, a light source which emits electromagnetic waves capable of transmitting the transparent support and active on the photopolymerization initiator used and which as a wavelength of 310 to 700 nm, more preferably, ultraviolet ray-visible light ray of 350 to 500 nm in wavelength, is used. For example, a high-pressure mercury lamp, a xenon lamp, a carbon arc lamp, a tungsten halogen lamp, a fluorescent lamp for copiers, etc. may be used. In addition, laser light, electron beams, X-rays, etc. may be used for the exposure.

After imagewise exposure, the transparent support is removed, and unexposed portions are dissolved away by a developing solution such as an organic solvent, an alkaline aqueous solution containing an organic solvent, an alkaline aqueous solution or the like to obtain a photo-hardened image on the base board.

After the image formation, desired processings may be conducted as the case demands. For example, in the case of forming a printed circuit board, bared metal may be etched using a known etching solution such as an aqueous solution of copper chloride or ferric chloride, or plating may be conducted on bared metals by using a known plating solution such as a solution of copper pyrophosphate or copper sulfate.

In addition, a photoresist may be formed by directly coating a solution of the photo-polymerizable composition of the present invention in an already mentioned solvent on a base board using a spinner, a whirler or the like, and drying the coated solution.

The photo-polymerizable composition of the present invention is particularly adapted for formation of printed-circuit boards and, further, may be used for a wide range of purposes such as formation of lithographic or letter-press printing plates, formation of relief, optical copying photographic pictures, etc.

The present invention is now illustrated in greater detail by reference to the following examples which, however, are not to be construed as limiting the present invention in any way. Unless otherwise indicated, parts are by weight.

EXAMPLES 1 TO 4 AND COMPARATIVE EXAMPLES 1 TO 7

The following materials were mixed to prepare a uniform solution (hereinafter referred to as mother liquor).

| | |
|---|---|
| 35 wt % solution of methyl methacrylate/methacrylic acid/2-ethylhexyl methacrylate/benzyl methacrylate copolymer (molar ratio = 55/28.8/11.7/4.5; weight-average molecular weight: 90,000) (solvent: methyl ethyl ketone/1-methoxy-2-propanol = 2/1 (by weight)) | 42.9 parts |
| Polypropylene glycol diacrylate (average molecular weight: 822) | 6.5 parts |
| Tetraethylene glycol dimethacrylate | 1.5 parts |
| p-Toluenesulfonamide | 0.5 part |
| Malachite Green oxalate (1% methanol solution) | 1.625 parts |
| 3-Morpholinomethyl-1-phenyl-triazole-2-thione | 0.01 part |

To the above-described mother liquor were added 4,4'-bis(diethylamino)benzophenone, benzophenone, phenyl tribromomethyl sulfone, 2-(2'-chlorophenyl)-4,5-diphenylimidazole dimer, Leuco Crystal Violet, or a compound represented by the formula (1) or (2) in amounts shown in Table 1 as Examples 1 to 4 and Comparative Examples 1 to 7. After further stirring to dissolve, each of the coating solutions was coated on a 23 $\mu$m polyethylene terephthalate tentative support, and dried at 100° C. for 2 minutes to obtain light-sensitive materials having about 40-$\mu$m thick light-sensitive coated layer. Each of these light-sensitive materials was laminated on a cleaned copper-laminated board (base board) at 105° C., then exposed in a varying exposure amount using a 3-kW super-high pressure mercury lamp (HMW-532D made by ORC) through one of two kinds of negative originals having the characteristic properties to be described hereinafter.

Chart A: line width/space width
(L/S)=1/1; line width=30 $\mu$m to 100 $\mu$m (10 $\mu$m step; five lines with each width)

Chart B: L/S=⅓; the rest being the same as with chart A

Furthermore, in order to evaluate sensitivity, Fuji Step guide P of 0.15 in step different of density was provided on both of the originals.

15 Minutes after the exposure, spray development was conducted for 40 seconds using a 1% sodium carbonate aqueous solution (30° C.) (spray pressure: 2 kg/cm$^2$), followed by washing with 20° C. water for 40 seconds. The thus-obtained resist patterns in conformity with originals A and B were observed under an optical microscope. Evaluation was conducted as follows.

MAXIMUM RESOLVING POWER

First, patterns obtained by exposing in an exposure amount of 40 mj/cm$^2$ through chart A were observed. Width of the thinnest lines (resolving power) not suffering delamination of the 5 lines or completely free of undeveloped portions was recorded. Then, exposure was repeatedly conducted with increasing the exposure amount at an interval of 20 mj/cm$^2$, and resolving power of each sample was recorded in the same manner. In general, resist patterns are liable to be delaminated in a low exposure amount region, and hence images of a thin line width cannot be obtained in such exposure region. On the other hand, in a high exposure amount region, clogging is liable to take place between lines, with this tendency increasing as the line width decreases. Therefore, the resolving power has a minimum value. Of the resolving powers obtained in a manner described above or respective exposure amounts, the smallest value is here taken as the maximum resolving power.

SENSITIVITY

Number of clear steps in the pattern of step guide obtained by a 100-mj exposure was taken as sensitivity. That is, a greater step number means a higher sensitivity.

ADHESION

A pattern for original B in an exposure amount giving the maximum resolving power was observed to record the thinnest line width not suffering delamination.

TENTING FILM STRENGTH

A light-sensitive coating film was laminated on both sides of a base board having 6 mm$\phi$ through-holes (200 holes), then exposed all over in an exposure amount providing the maximum resolving power, then developed under the already mentioned conditions to form tenting films. Then, an aqueous solution of copper chloride was sprayed over it (35 Be; 45° C.; 2.5 kg/cm$^2$; 4 min.), followed by spraying with water (18° C., 2 kg/cm$^2$, 3 min.). After repeating this procedure two times more, the ratio of broken tenting film was recorded.

Results thus obtained are shown in Table 1.

broken ratio. In addition, the composition provides the advantage of improving sensitivity.

EXAMPLES 5 AND 6 AND COMPARATIVE EXAMPLE 8

40-μm light-sensitive coating films were obtained in the same manner as in Examples 1 to 4 and Comparative Examples 1 to 7 except for adding those compounds which are shown in Table 2 as photo-polymerization initiator systems to the aforesaid mother liquor.

Each of them was exposed in an exposure amount of 100 mj/cm$^2$ using the aforesaid super-high pressure mercury lamp. After 3 minutes, absorbance at 590 nm was measured using a UV-visible light spectrosensitom-

TABLE 1

| Example No. | 4,4'-Bis (diethyl amino)- benzo- phenone (parts) | 2-(2'- Chloro phenyl)- imidazole dimer (parts) | Aromatic Ketone Benzo- phenone (parts) | Aromatic Ketone Compound of formula (1) (parts) | Organic Halogen Compound Phenyl Tribromo- methyl sulfone (parts) | Organic Halogen Compound Compound of formula (2) (parts) | Leuco Crystal Violet (parts) |
|---|---|---|---|---|---|---|---|
| Example 1 | 0.04 | 0.5 | 1.0 | — | 0.05 | — | 0.01 |
| Example 2 | 0.04 | 0.5 | — | 1.0 | 0.05 | — | 0.01 |
| Example 3 | 0.04 | 0.5 | 1.0 | — | — | 0.1 | 0.01 |
| Example 4 | 0.04 | 0.25 | 1.0 | — | 0.15 | — | 0.20 |
| Comparative Example 1 | 0.04 | — | 1.0 | — | — | — | 0.20 |
| Comparative Example 2 | 0.04 | — | — | — | 0.5 | — | 0.20 |
| Comparative Example 3 | 0.04 | 1.0 | — | — | — | — | 0.20 |
| Comparative Example 4 | 0.04 | — | 1.0 | — | 0.5 | — | 0.20 |
| Comparative Example 5 | 0.04 | 0.5 | — | — | 0.05 | — | 0.20 |
| Comparative Example 6 | 0.04 | 0.5 | 1.0 | — | 0.05 | — | — |
| Comparative Example 7 | — | 0.5 | 1.0 | — | 0.05 | — | 0.20 |

| Example No. | Maximum Resolving Power (μm) | Adhesion (μm) | Sensitivity (steps) | Tent- Broken Ratio (%) | Notes |
|---|---|---|---|---|---|
| Example 1 | 40 | 30 | 9 | 0.05 | Compound of formula (1): benzophenone with C(OCH$_3$)$_2$ linking two phenyl groups (C=O at center) |
| Example 2 | 40 | 30 | 9 | 0.05 | |
| Example 3 | 40 | 30 | 10 | 0 | |
| Example 4 | 40 | 40 | 9 | 0.10 | |
| Comparative Example 1 | 60 | 80 | 8 | 100 | Compound of formula (2): phenyl with three N=C(CCl$_3$) groups (triazine-like) |
| Comparative Example 2 | 50 | 50 | 5 | 10.5 | |
| Comparative Example 3 | 50 | 30 | 8 | 0.50 | |
| Comparative Example 4 | 50 | 60 | 9 | 4.5 | |
| Comparative Example 5 | 40 | 40 | 8 | 0.93 | |
| Comparative Example 6 | 40 | 40 | 7 | 2.6 | |
| Comparative Example 7 | 50 | 30 | 6 | 0.22 | |

As is clear from the results, a combination of the photo-polymerization initiator system, an organic halogen compound, and a leuco dye of the present invention can provide markedly improved resolving power and adhesion, and serves to greatly reduce the tenting filmeter (Shimazu Graphicode UV-240). Printing out density, $\Delta D$, was determined by subtracting an absorbance obtained by measuring absorbance of the coated film before exposure in the same manner from the above-measured absorbance after the exposure. Results thus obtained are shown in Table 2.

TABLE 2

| Example No. | 4,4'-Bis(di-ethylamino)-benzophenone (parts) | 2-(2'-Chlorophenyl)-4,5-diphenyl-imidazole dimer (parts) | Benzophenone (parts) | Phenyl tribromo-methyl sulfone (parts) | Leuco Crystal Violet (parts) | ΔD |
|---|---|---|---|---|---|---|
| Example 5 | 0.04 | 0.5 | 1.0 | 0.05 | 0.20 | 0.90 |
| Example 6 | 0.04 | 0.5 | 1.0 | 0.10 | 0.20 | 1.35 |
| Comparative Example 8 | 0.04 | 1.0 | — | — | 0.20 | 0.55 |

As is clear from the above results, the combination of a photo-polymerization initiator system, an organic halogen compound and a leuco dye in accordance with the present invention can markedly enhance efficiency of printing out.

While the invention has been described in detail and with reference to specific embodiments thereof, it will be apparent to one skilled in the art that various changes and modifications can be made therein without departing from the spirit and scope thereof.

What is claimed is:

1. A photo-polymerizable composition which comprises:
    a thermoplastic polymeric binder;
    a non-gaseous ethylenically unsaturated compound;
    a photo-polymerization initiator system comprised of 4,4'-bis(dialkylamino)benzophenone, aromatic ketone and lophine dimer;
    an organic halogen compound; and
    a leuco dye, wherein said organic halogen compound is selected from the compounds represented by the following formulae IIIa to IIIe:

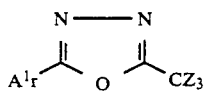   IIIa wherein $A^1r$ represents a substituted or unsubstituted phenyl or a substituted or unsubstituted naphthyl group, and Z represents a chlorine atom or a bromine atom;

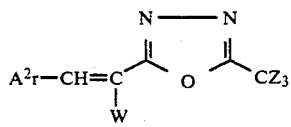   IIIb wherein $A^2r$ represents a substituted or unsubstituted aryl group, W represents a hydrogen atom or a $C_1$ to $C_{20}$ alkyl or a $C_6$ to $C_{20}$ aryl group, and Z represents a chlorine atom or a bromine atom;

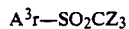   IIIc wherein $A^3r$ represents a substituted or unsubstituted phenyl or a substituted or unsubstituted naphthyl group, and Z represents a chlorine atom or a bromine atom;

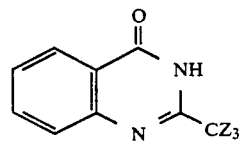   IIId wherein Z represents a chlorine atom or a bromine atom; and

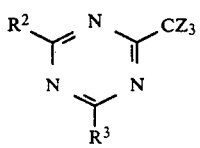   IIIe wherein $R^2$ represents $CZ_3$ or a substituted or unsubstituted phenyl or a substituted or unsubstituted naphthyl group, $R^3$ represents $CA_3$, $NH_2$, $NHR^4$, $N(R^4)_2$, $SR^4$, $OR^4$ or $R^4$, $R^4$ represents a $C_1$ to $C_{20}$ alkyl, a $C_6$ to $C_{20}$ aryl or a $C_2$ to $C_{20}$ alkenyl group, and Z represents a chlorine atom or a bromine atom.

2. A photo-polymerizable composition as in claim 1, wherein said thermoplastic polymeric binder has a molecular weight of from 5,000 to 2,000,000.

3. A photo-polymerizable composition as in claim 1, wherein said thermoplastic polymeric binder is present in an amount of 5 to 95 weight percent based on the solid components of the photo-polymerizable composition.

4. A photo-polymerizable composition as in claim 1, wherein said non-gaseous ethylenically unsaturated compound is a compound which has at least two terminal unsaturated groups and which can be photo-polymerized by irradiation with actinic radiation.

5. A photo-polymerizable composition as in claim 1, wherein said non-gaseous ethylenically unsaturated compound is present in an amount of from 5 to 90 weight percent.

6. A photo-polymerizable composition as in claim 1, wherein said 4,4'-bis(dialkylamino)benzophenone is present in an amount of from 0.01 weight percent to 1 weight percent based on the solid components of the photo-polymerizable composition, said aromatic ketone is present in an amount of from 0.1 weight percent to 10 weight percent based on the solid components of the photo-polymerizable composition, and said lophine dimer is present in an amount of from 0.1 weight percent to 10 weight percent based on the solid components of the photo-polymerizable composition.

7. A photo-polymerizable composition as in claim 1, wherein said 4,4'-bis(dialkylamino)benzophenone is present in an amount of from 0.05 weight percent to 0.5 weight percent based on the solid components of the photo-polymerizable composition, said aromatic ketone is present in an amount of from 0.5 weight percent to 5.0 weight percent based on the solid components of the photo-polymerizable composition, and said lophine dimer is present in an amount of from 0.5 weight percent to 5.0 weight percent based on the solid components of the photo-polymerizable composition.

8. A photo-polymerizable composition as in claim 1, wherein said organic halogen compound is present in an amount of from 0.001 weight percent to 5 weight percent based on the solid components of the photo-polymerizable composition.

9. A photo-polymerizable composition as in claim 1, wherein said organic halogen compound is present in an amount of from 0.005 weight percent to 1 weight percent based on the solid components of the photo-polymerizable composition.

10. A photo-polymerizable composition as in claim 1, wherein said organic halogen compound is a compound having 3 halogen atoms bound to the same carbon atom.

11. A photo-polymerizable composition as in claim 1, wherein said organic halogen compound is selected from tribromomethyl phenyl sulphone and 2,4-bis(trichloromethyl)-6-phenyltriazole.

12. A photo-polymerizable composition as in claim 1, wherein the leuco dyes are present in an amount of from 0.01 to 10 weight percent based on the solid components of the photo-polymerizable composition.

13. A photo-polymerizable composition which comprises:
- a thermoplastic polymeric binder;
- a non-gaseous ethylenically unsaturated compound;
- a photo-polymerizable initiator system comprised of 4,4'-bis(dialklamino)benzophenone, aromatic ketone and lophine dimer;
- an organic halogen compound having three halogen atoms bound to the same carbon atom; and
- a leuco dye.

* * * * *